(12) United States Patent
Nasu (10) Patent No.: US 6,388,924 B1
(45) Date of Patent: May 14, 2002

(54) SEMICONDUCTOR INTEGRATED DEVICE AND ELECTRONIC APPARATUS MOUNTED WITH THE DEVICE

(75) Inventor: Hiroaki Nasu, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/806,561

(22) PCT Filed: Aug. 2, 2000

(86) PCT No.: PCT/JP00/05194

§ 371 Date: Mar. 30, 2001

§ 102(e) Date: Mar. 30, 2001

(87) PCT Pub. No.: WO01/09901

PCT Pub. Date: Feb. 8, 2001

(30) Foreign Application Priority Data

Aug. 2, 1999 (JP) ............................................ 11-218951

(51) Int. Cl.[7] .................................................. G11C 7/00
(52) U.S. Cl. .................................................. 365/189.09
(58) Field of Search .......................... 365/189.09, 207, 365/194; 327/172, 173

(56) References Cited

U.S. PATENT DOCUMENTS

| 5,898,625 A | * | 4/1999 | Manning ................ 365/189.09 |
| 5,909,403 A | * | 6/1999 | Fujitaka ................. 365/189.09 |
| 6,185,145 B1 | * | 2/2001 | Marritt ................... 365/189.09 |

FOREIGN PATENT DOCUMENTS

| EP | 0453206 | 10/1991 |
| JP | 03-296996 | 12/1991 |
| JP | 05-189982 | 7/1993 |

* cited by examiner

*Primary Examiner*—Tan T. Nguyen
(74) *Attorney, Agent, or Firm*—Hogan & Hartson, L.L.P.

(57) ABSTRACT

By differentiating and using the signal that makes reference potential generation circuit become active (differentiating pulse generation block 1), and by operating the reference potential generation circuit for a certain period of time, the current consumption can be reduced in proportion to the frequency when the operation frequency is low. Also, unstable operation during high speed operation of the memory is prevented by using the differentiating pulse generation block 1 when the pulse width of an input signal is long, and by using a clock that is generated through an oscillator when the pulse width of the input signal is short.

11 Claims, 10 Drawing Sheets

SEMICONDUCTOR INTEGRATED DEVICE AND ELECTRONIC APPARATUS MOUNTED WITH THE DEVICE

TECHNICAL FIELD

The present invention relates to a semiconductor integrated device, which is embedded with a reference potential generation circuit that uses a pseudo memory cell formed on a semiconductor substrate.

BACKGROUND ART

With the advancement of semiconductor mounting techniques, inexpensive one-chip microprocessors which have a memory, such as a ROM and the like built in have become available, and have been installed in electronic apparatuses such as clocks, game machines, mobile phones and the like.

A reading circuit for the above-mentioned built-in memory is made of a sense amplifier, and is constituted of a load circuit, a pseudo memory cell (dummy cell) and a transistor, which are arranged at the periphery of a memory cell. Further, these load circuit, dummy cell, and transistor are used to provide a reference voltage to a reading bit line. Moreover, the dummy cell has the same structure as the cell that constitutes the memory.

The basic structure and operation of the reference potential generation circuit in the reading circuit of the above-described built-in memory is, for example, disclosed in Japanese Unexamined Patent Application Publication No. 5-189982.

However, according to the above-mentioned structure, a DC current flows between the load circuit and the dummy cell even during low speed operation of the memory, and the current drain (consumption) generated at that time can no longer be ignored. This phenomenon shows up noticeably in particular when a flash-memory is used as the memory, thus power efficiency has been the most important design problem.

DISCLOSURE OF INVENTION

The present invention is made in view of the above-mentioned reasons, and it is an object of the present invention to provide a semiconductor integrated device which aims to reduce current drain (consumption) during low speed operation of a memory by activating a reference potential generation circuit, using a differentiating circuit that generates a short signal when the pulse width of an input signal is long, and also to provide an electronic apparatus into which the device is loaded.

It is also an object of the present invention to provide a semiconductor integrated device in which unstable operation during high speed operation of a memory is prevented by using a clock that is generated through an oscillator when the pulse width of an input signal is short, and by using the above-mentioned differentiating circuit when the pulse width of an input signal is long, and also to provide an electronic apparatus into which the device is loaded.

In order to achieve the above-mentioned object, a semiconductor integrated device of the present invention is such that in a semiconductor integrated device which is embedded with a reference potential generation circuit that uses a memory cell, the semiconductor integrated device includes a differentiating pulse generation circuit for generating a shorter signal when the pulse width of an input signal is long and for activating the reference potential generation circuit.

Also in a semiconductor integrated device which is embedded with a reference potential generation circuit that uses a pseudo memory cell, the semiconductor integrated device is characterized in that with a differentiating pulse generation circuit constituted of a delay circuit and a gate circuit, a shorter signal is generated when the pulse width of an input signal is long, and the reference potential generation circuit is activated.

The above-mentioned semiconductor integrated device is, characterized in that the pseudo memory cell is constituted of a non-volatile memory.

According to the above-mentioned configuration of the present invention, since the time for operating the reference potential generation circuit can be made constant when the operation frequency is low, the duty ratio when the frequency decreases can be made larger, and it is possible to substantially reduce the current consumption.

A second semiconductor integrated device of the present invention is such that in a semiconductor integrated device which is embedded with a reference potential generation circuit that uses a pseudo memory cell, and a sense amplifier that operates by inputting a reference potential that is generated by the reference potential generation circuit, the semiconductor integrated device is characterized in that a reference potential is supplied to the sense amplifier only when a reference potential generation circuit enable signal that is generated by a differentiating pulse generation circuit is active.

Also, in the above-mentioned semiconductor integrated device, the pseudo memory cell is constituted of a non-volatile memory.

According to the above-mentioned configuration of the present invention, since the time for supplying the reference potential to the sense amplifier can be made constant when the operation frequency is low, even when the DC current flows because of insufficient writing of the memory cell, the active time of the sense amplifier can be shortened when the frequency decreases can be made larger, and it is possible to reduce the current consumption.

Also, the above-mentioned semiconductor integrated device is characterized in that a reference potential is supplied to the sense amplifier by the differentiating circuit output when the pulse width of the input signal is long, and by a clock that is generated through an oscillator when the pulse width of the input signal is short-.

Further, in the above-mentioned semiconductor integrated device, a relative length of the pulse width of the input signal is determined by a clock switching signal that is set as programmable in a register which is stored in the device.

Also, in the above-mentioned semiconductor integrated device, a relative length of the pulse width of the input signal is determined by a selection signal of an oscillator that is set as programmable in a register which is stored in the device.

According to the above-mentioned configuration of the present invention, an unstable operation during high speed operation can be prevented by using the above-mentioned differentiating circuit output when the pulse width of the input signal is long, and by using the clock that is generated through the oscillator when the pulse width of the input signal is short. It is possible to reduce the current consumption during low speed operation, and it can be operated at a high frequency in synchronization with the clock during high speed operation.

An electronic apparatus into which a semiconductor integrated device is installed is characterized in that, in the electronic apparatus, the semiconductor integrated device is embedded with a reference potential generation circuit that uses a memory cell, the electronic apparatus being characterized in that the electronic apparatus is installed with the semiconductor integrated device including a differentiating pulse generation circuit for generating a short signal when the pulse width of an input signal is long and for activating the reference potential generation circuit.

Also, the above-mentioned electronic apparatus is installed with a semiconductor integrated device which supplies a reference potential to the sense amplifier by the differentiating circuit output when the pulse width of the input signal is long, and by a clock that is generated through an oscillator when the pulse width of the input signal is short.

According to the above-mentioned configuration, by using the semiconductor integrated device which, with the differentiating circuit, generates a shorter signal when the pulse width of the input signal is long, and activates the reference potential generation circuit, since the duty ratio when the frequency decreases can be made larger, it is possible to provide an electronic apparatus which reduces the current consumption substantially. Further, by using the differentiating circuit when the pulse width of the input signal is long, and by using the clock that is generated through the oscillator when the pulse width of the input signal is short, a reduction of the current consumption is made possible during low speed operation, and thus it is possible to provide an electronic apparatus which operates at a high frequency in synchronization with the clock during high speed operation.

BEST MODE FOR CARRYING OUT THE INVENTION

In the following, an embodiment of the present invention will be described with reference to the drawings.

Figure 1:
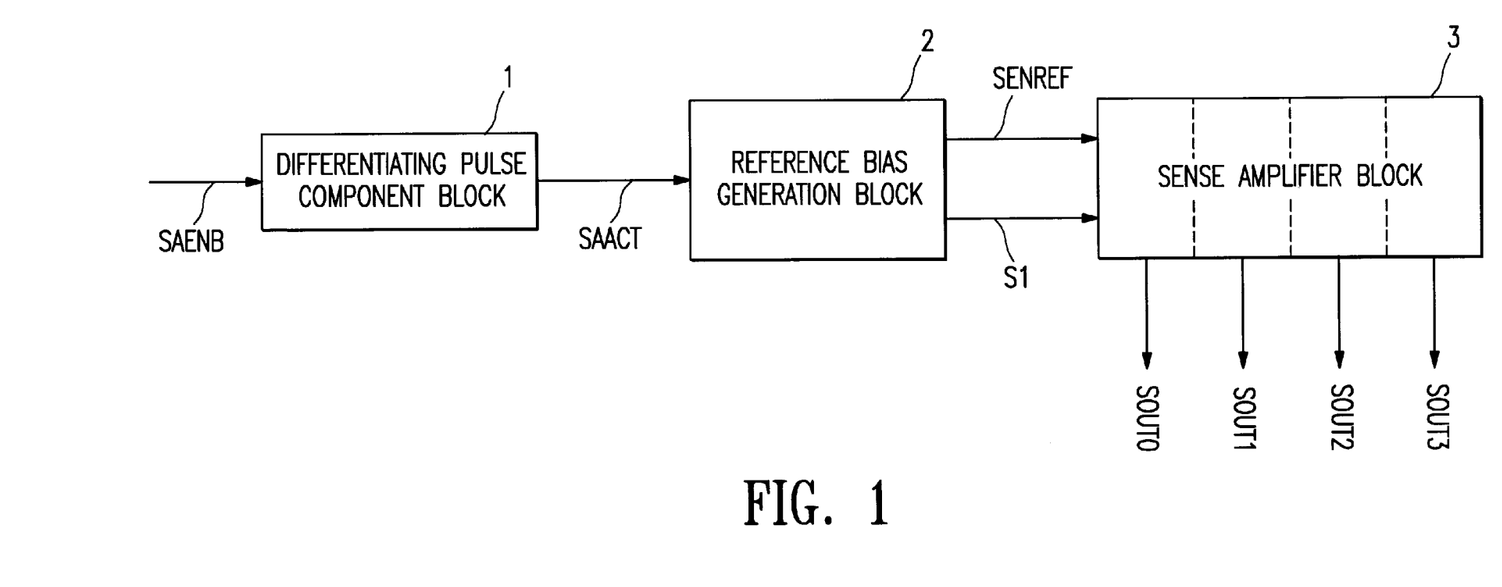
FIG. 1 is a block diagram showing a semiconductor integrated device according to the present invention.

FIG. 1 is a block diagram of a semiconductor integrated device according to the present invention. A signal SAENB that makes a reference bias generation circuit 2 and a sense amplifier block 3 active is input into a differentiating pulse generation block. The above-mentioned differentiating pulse generation block generates a signal SAACT of a pulse width required accessing the reference bias generation circuit and the sense amplifier from an rising edge of the SAENB. The SAACT is input into the above-mentioned reference bias generation block, and SENREF that becomes a reference of the above-mentioned sense amplifier and a signal S1 for connecting the sense amplifier and a bit line are output. In the present embodiment, the sense amplifier block is a 4-bit structure, and SOUT0 to 3 are output therefrom. It is apparent that the bit structure of the sense amplifier is not limited to a width of 4 bits, and it may be of any structure such as 8 bits, 16 bits, 32 bits and the like.

Figure 2:
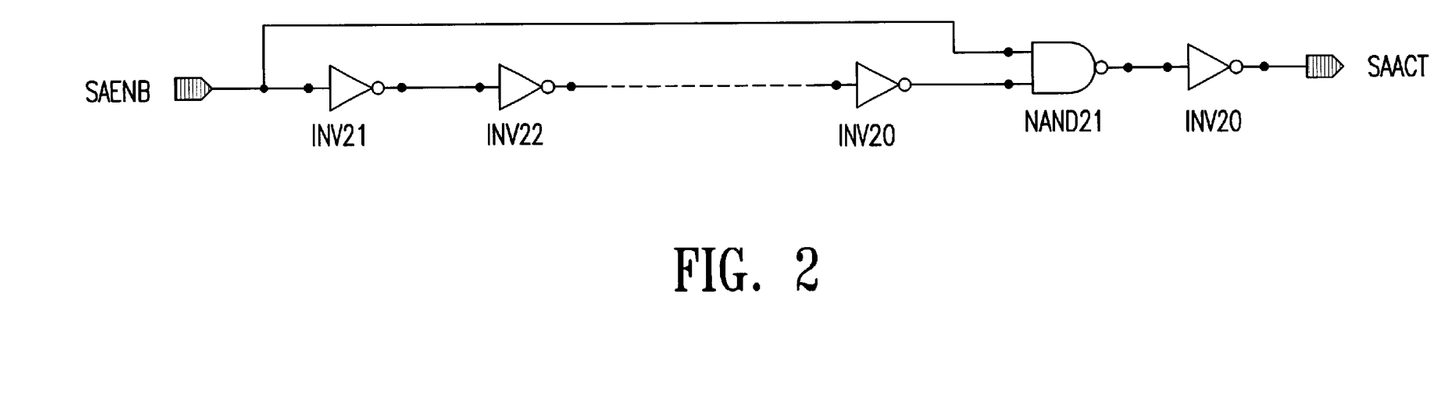
FIG. 2 is a circuit diagram showing a differentiating pulse generation block according to the present invention.

FIG. 2 is a circuit diagram showing one embodiment of the differentiating pulse generation block of the semiconductor integrated device according to the present invention. In the figure, inverter circuits INV21–INV2n are delay inverters, wherein n indicates an odd number, which generate a delay required for securing a necessary pulse width for accessing the sense amplifier.

Figure 3:
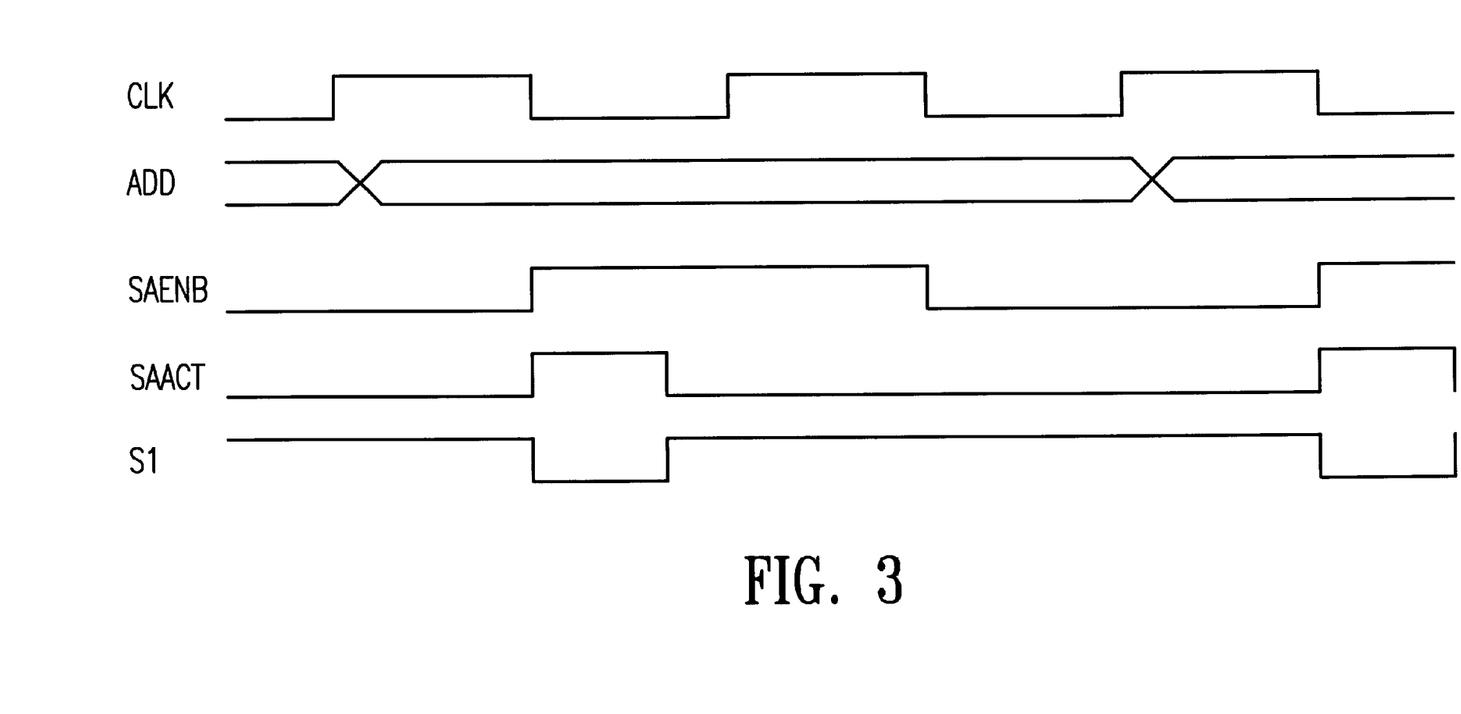
FIG. 3 is an operational timing diagram of the semiconductor integrated device according to the present invention.

FIG. 3 is a timing diagram in a case in which the active width of the SAENB signal is sufficiently longer than the above-mentioned delay time, and when the SAENB signal changes from an "L" level to an "H" level, an output signal of the NAND circuit NAND21 becomes an "L" level because an output signal of the inverter circuit INV2n still holds the "H" level, and the output signal SAACT of the inverter circuit INV20 becomes an "H" level. If the delay time that is determined by the delay inverter circuits INV21–INV2n has passed, the output signal of the above-mentioned inverter circuit INV2n becomes an "l" level, the NAND circuit NAND21 output signal becomes an "H" level, the output signal SAACT of the inverter circuit INV20 becomes an "L" level, and a signal having a pulse width that is determined by the delay time of the above-mentioned delay inverters is generated.

Figure 4:
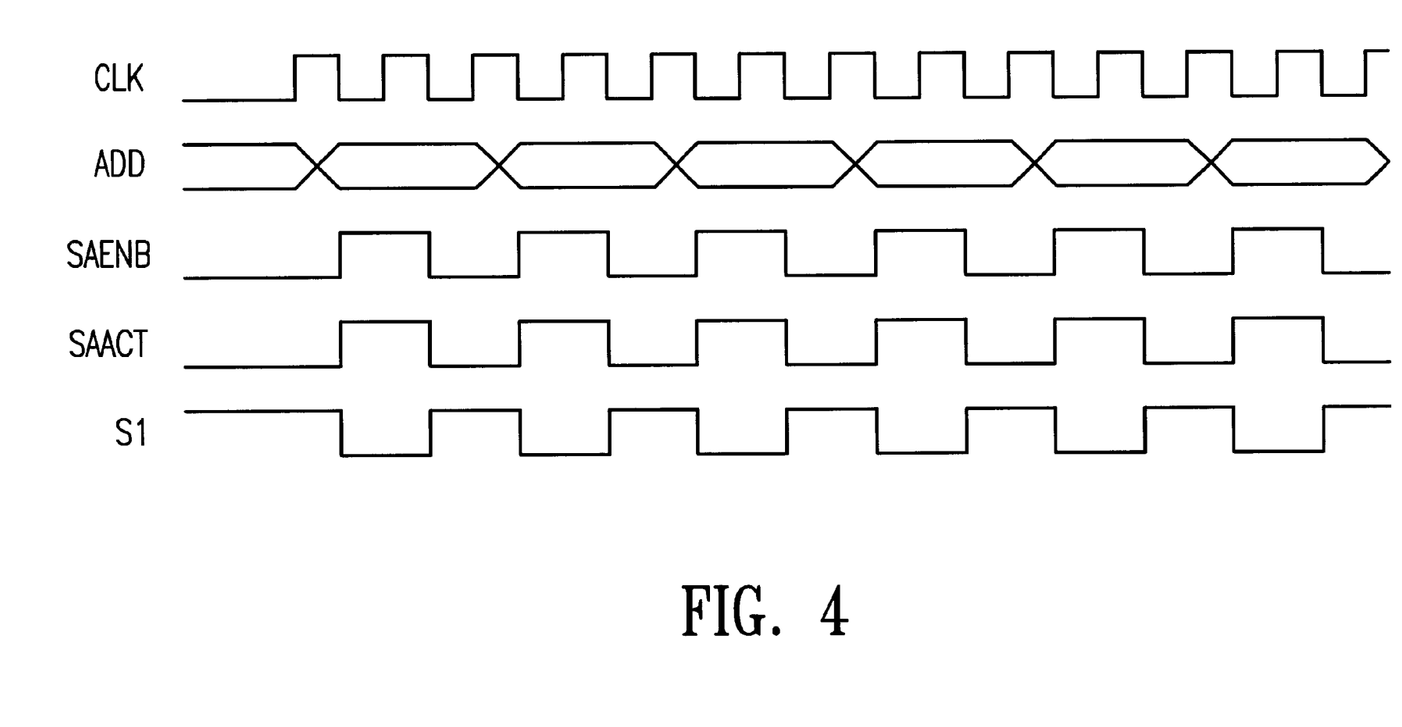
FIG. 4 is an operational timing diagram the semiconductor integrated device according to the present invention.

FIG. 4 is a timing chart when the active width of the SAENB signal is shorter than the above-mentioned delay time, and when SAENB changes from an "L" level to an "H" level, the output signal of the NAND circuit NAND21 becomes an "L" level because the output signal of the inverter circuit INV2n still holds the "H" level, and the output signal SAACT of the inverter circuit INV20 becomes an "H" level. Then, if the SAENB signal changes from an "H" level to an "L" level before the above-mentioned delay time has passed, then the output signal of the NAND circuit NAND21 becomes an "H", and the output signal SAACT of the inverter circuit INV20 becomes an "L" level. At this moment, the pulse width of SAACT becomes approximately equal to the pulse width of SAENB.

Figure 5:
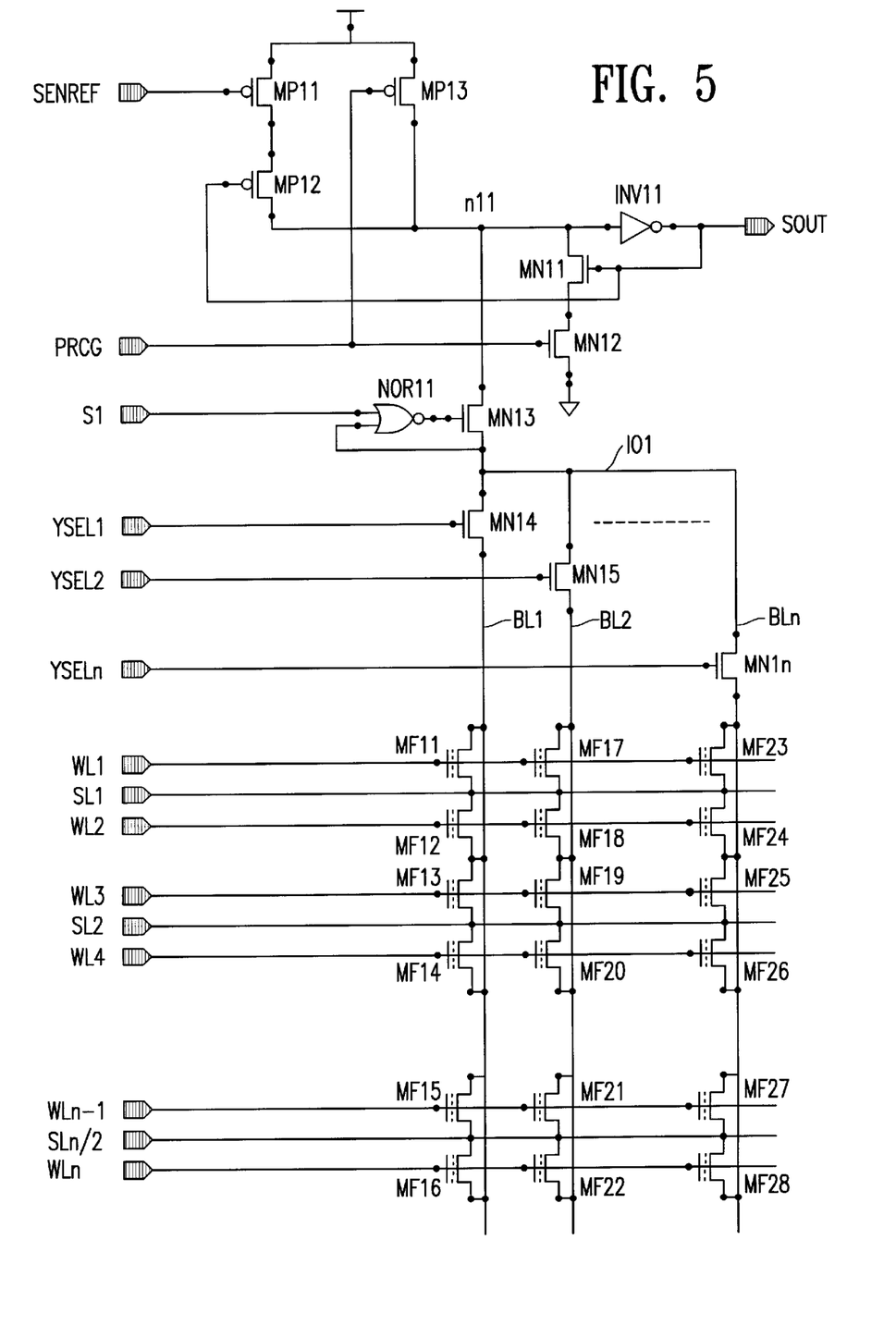
FIG. 5 is a circuit diagram showing a sense amplifier block of the semiconductor device according to the present invention.

FIG. 5 is a circuit diagram showing one example of the sense amplifier block. The present sense amplifier is constituted of a P-type MOS transistor MP11 to which the output signal SENREF of the reference current generation circuit is set as a gate input such that a source is connected to a power supply, a P-type MOS transistor MP12 that is connected to MP11 in series, a P-type MOS transistor MP13 to which a pre-charge signal PRCG is set as a gate input, an inverter circuit INV11 of which a node n11 to which the MP12 and MPl3 are connected is set as an input, an N-type MOS transistor MN11 of which an output SOUT of INV11 is set as a gate input, and an N-type MOS transistor MN12 for cutting off a path to VSS during pre-charge such that the pre-charge signal PRCG is set as a gate input and the source is connected to a ground line VSS.

The inverter circuit INV11 and the N-type MOS transistor MN11 constitute an inverting amplifier. When the pre-charge signal PRCG becomes an "L" level, the MP13 turns ON and the MN12 turns OFF, and thus causing the node n11 to rise until the VDD potential is reached.

The N-type MOS transistor MN13 separates the sense amplifier and the IO node 101. MN 13 prevents the potential of the IO node and of the bit lines BL1, BL2, BLn from rising too much during pre-charge. An output of the NOR gate NOR11 is connected to the gate of the N-type MOS transistor MN13. An enable signal SI (active "L") and the IO node 101 are connected to the NOR gate NOR11.

Non-volatile memory transistors MF11–MF16, MF17–MF22, and MF23–MF28 are connected to the bit lines BL1, BL2, and BLn, respectively, and each memory transistor is arranged as one source line arranged between two word lines, and is connected to each bit line in parallel. When an address signal is input, any one of the word lines among WL1 to WLn that is specified by the address signal is selected. Similarly, as one bit line selection signal among the YSEL1 to YSELn is selected, one of the memory transistors MF1–MF28 is selected.

When the selected memory transistor is in an erase state, if the power supply VDD is 5 V, then it has a function of making a current of approximately 120 $\mu$A flow from the drain=bit line to the ground line VSS. On the other hand, when it is in a program state, the current which flows is almost zero even if the power supply VDD is 5 V.

Figure 6:
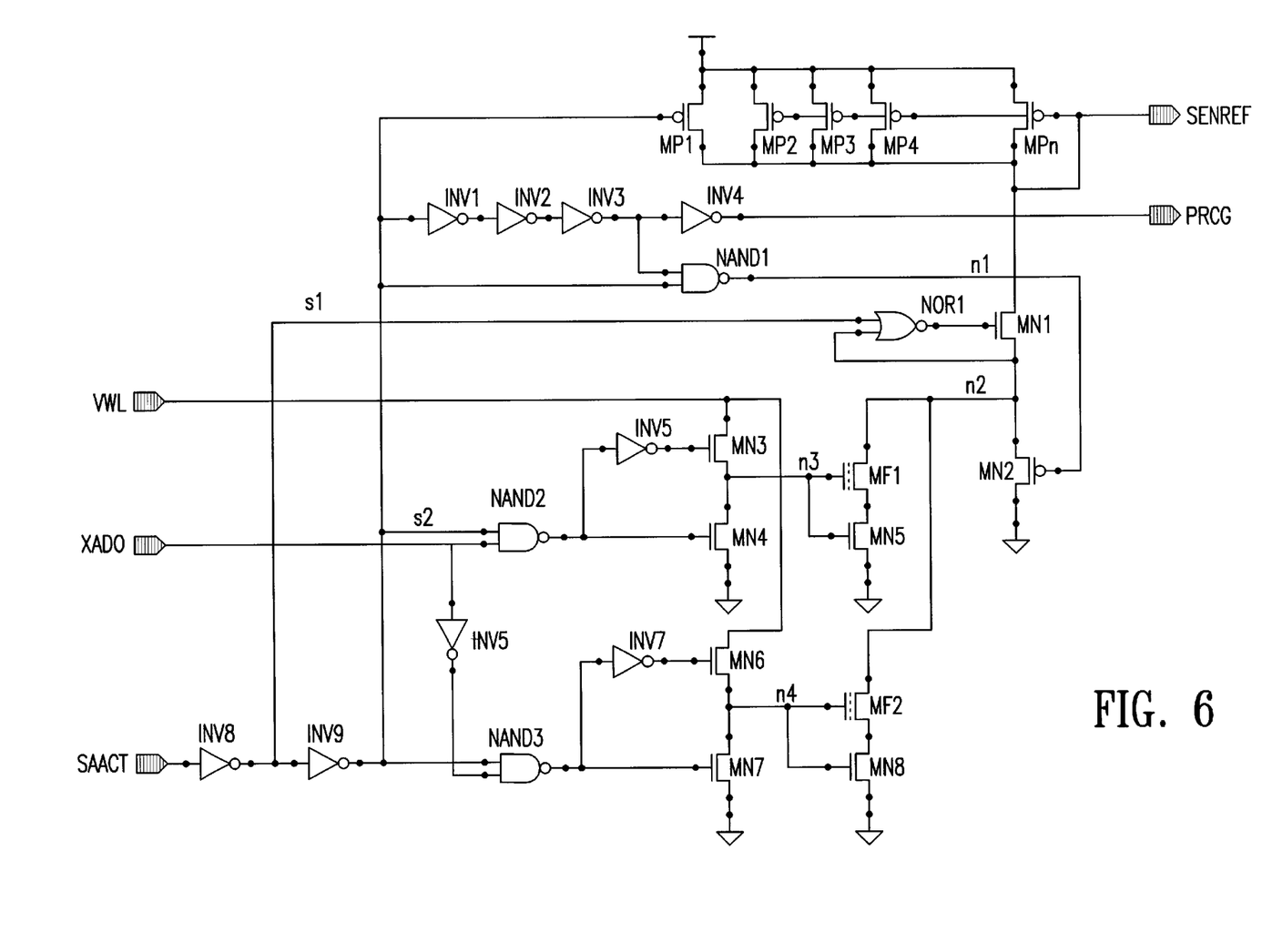
FIG. 6 is a circuit diagram showing a reference bias generation block of the semiconductor device according to the present invention.

FIG. 6 is a circuit diagram showing one example of the reference bias generation block. A signal SAACT is a signal for enabling the sense amplifier and the reference bias generation circuit, and is input into the inverter circuit INV8. An output signal S1 of the inverter circuit INV8 is input into the NOR gate NOR1 and also is input into the NOR gate NOR11 of the sense amplifier. Further, the S1 signal is also input into the delay circuit constituted of the inverter circuit INV9, INV1, INV2, INV3, INV4, and is output as an output signal PRCG of the inverter circuit INV4, and becomes the pre-charge signal PRCG of the sense amplifier.

An output signal S2 of the inverter circuit INV9 is input to a gate of the P-type MOS transistor MP1 for use in the SENREF signal pull-up. An output of the NOR gate NOR1 is connected to a gate of the N-type MOS transistor MN1. The N-type MOS transistor MN1 and the NOR gate NOR1 are placed in order to make a circuit structure equivalent to the sense amplifier, and there is no harm if it takes a circuit structure in which a source and a drain of the MN1 are connected directly.

A memory transistor MF1 and an N-type MOS transistor MN5, and a memory transistor MF2 and an N-type MOS transistor MN8 constitute dummy memory cells, and it is arranged that any of these can be selected according to an address signal XAD0. It is linked to a selection of a pair of two word lines, which are sandwiched between the source lines of the sense amplifier.

A n:1 current mirror circuit is constituted of the P-type MOS transistors MP2, MP3, MP4, MPn and the P-type MOS transistor MP11 of the sense amplifier. 1/n of the current flowing into the dummy memory cell circuit through the nodes SENREF and n2 of the reference bias generation circuit is a current that can flow to the node n11 of the sense amplifier.

Figure 7:
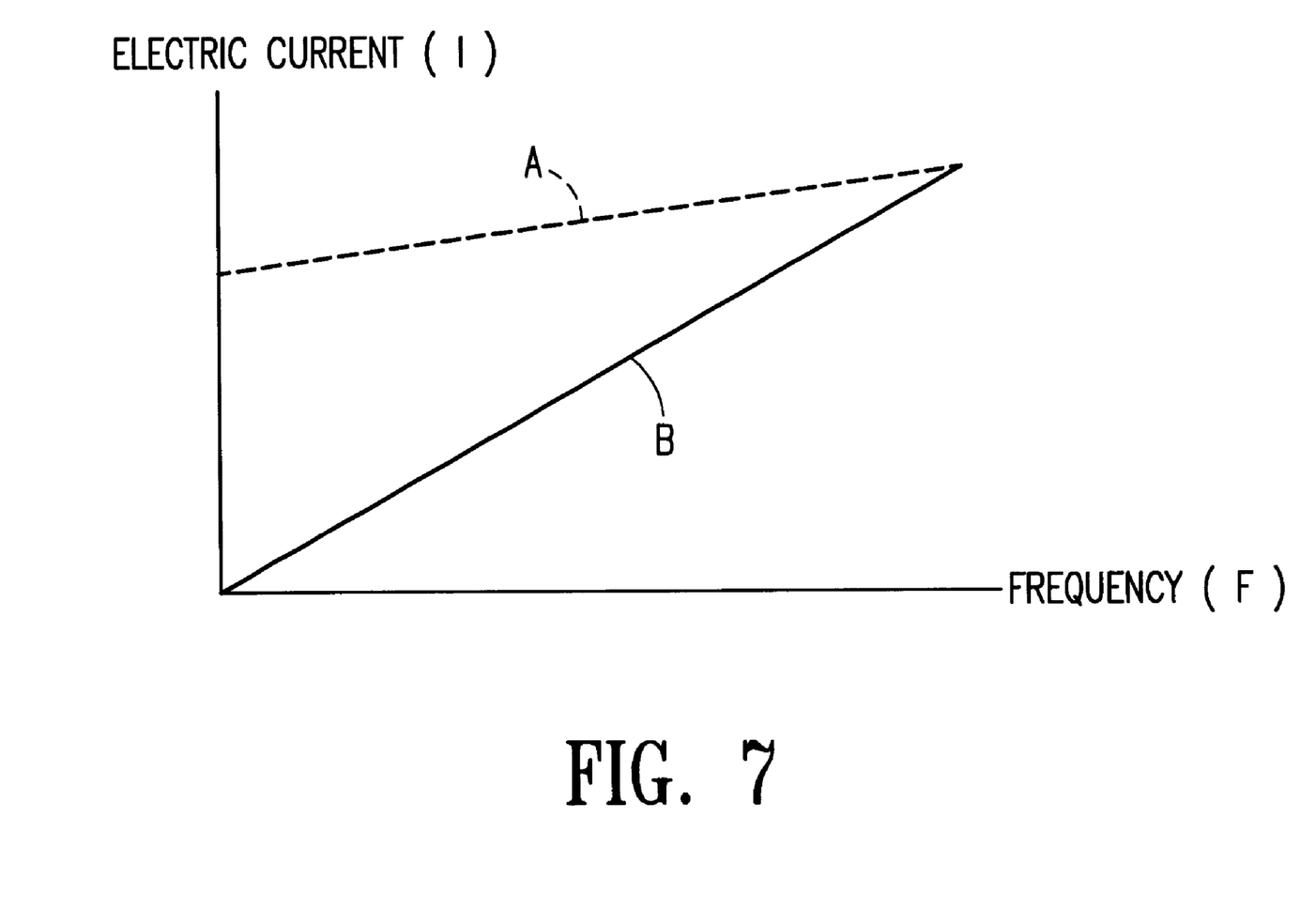
FIG. 7 is a characteristic diagram of the semiconductor device according to the present invention.

FIG. 7 is a characteristic diagram representing a change in the current drain (consumption) versus the frequency of SAENB. In the figure, a reference numeral A indicates the current drain when the SAENB signal is input into the reference bias generation block and the sense amplifier block, and the current is not substantially reduced since a DC current flows in the reference bias generation block even if the frequency decreases. In the figure a reference numeral B indicates that the current drain when the SAATC signal is input into the reference bias generation block, and since the reference bias generation block is stopped after being operated for a certain period of time, if the frequency decreases, then the duty ratio becomes larger and is proportional to the frequency.

As described above according to the present invention, since a time for operating the reference potential generation circuit can be made constant when the operation frequency is low, the duty ratio when the frequency decreases can be made larger, and thus the current drain can be reduced substantially.

On the other hand, although the above-mentioned effect (advantage) is obtained during low speed operation, it may be considered that as the frequency to be used during high speed operation increases, the operation becomes unstable because of the existence of the differentiating circuit. Thus, herein, a selection circuit is added which uses a signal for operating the sense amplifier for a certain period of time by the differentiating circuit during low speed operation, and uses the SAENB signal generated by the clock as it is during high speed operation.

Figure 8:
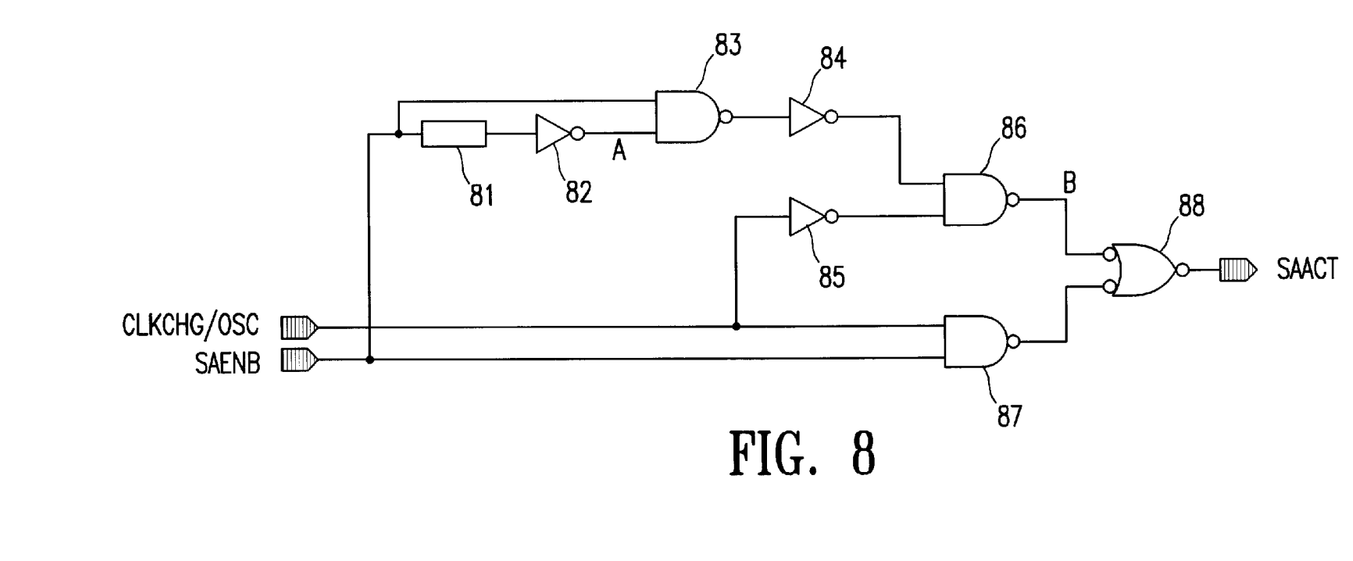
FIG. 8 is a circuit diagram showing another embodiment of a differentiating pulse generation block according to the present invention.
Figure 9:
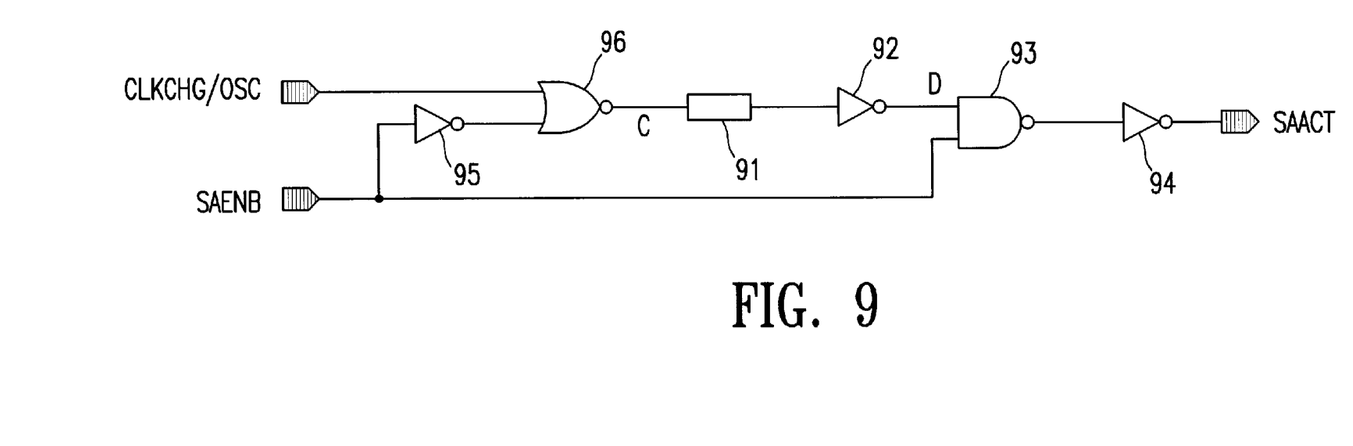
FIG. 9 is a timing chart showing an operation of the embodiment shown in FIG. 8.
Figure 10:
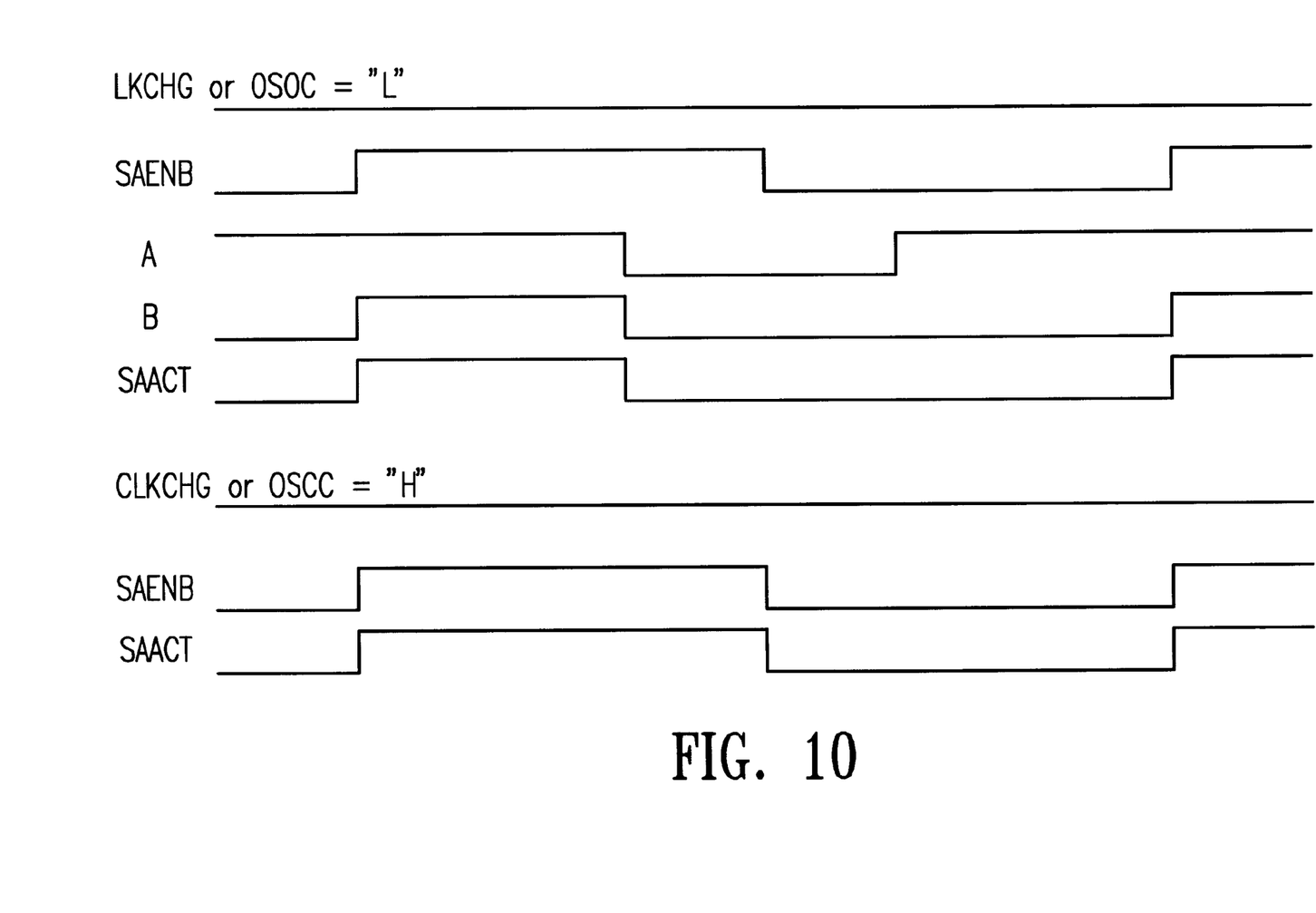
FIG. 10 is a circuit diagram showing still another embodiment of a differentiating pulse generation block according to the present invention.
Figure 11:
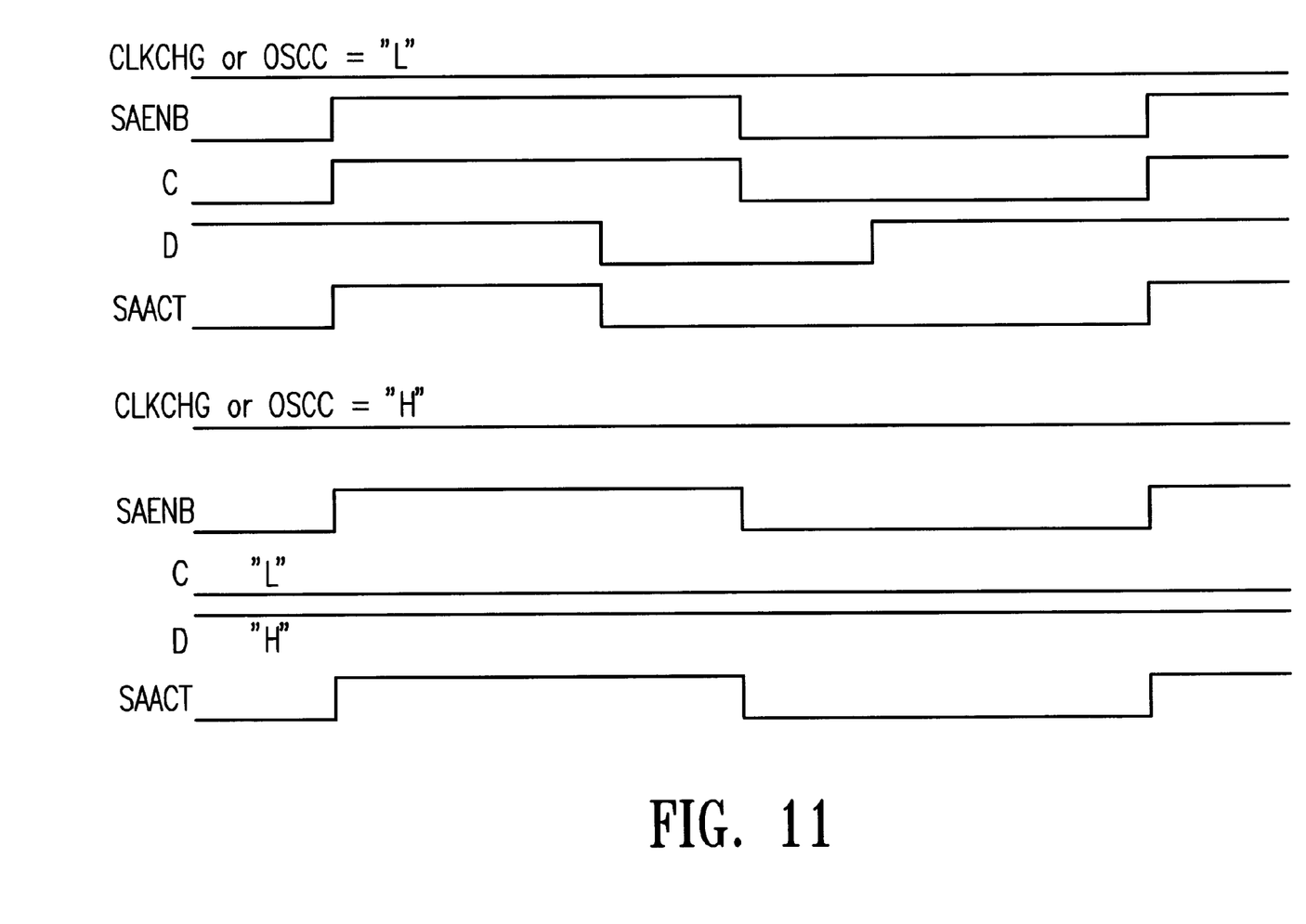
FIG. 11 is a timing chart showing an operation of the embodiment shown in FIG. 10.

FIG. 8 and FIG. 9 show the circuit configurations thereof, and FIG. 10 and FIG. 11 show the operation timing charts thereof. It is assumed that an operation switch for any case is performed by either a CPU clock switching signal (CLKCHG) or a high speed oscillator ON/OFF control signal (OSCC). Both CLKCHG and OSCC are signals that are controlled based on values set as programmable in a register stored in the semiconductor integrated device by a CPU (not shown). Herein, it is assumed that two kinds are prepared: a frequency of 4 MHz to be operated in a high speed mode, and a frequency of 32.768 kHz to be operated in a low speed mode.

In the circuit configuration example shown in FIG. 8, reference numeral 81 indicates the above-described differentiating circuit, in which the SAENB signal generated by the clock is-obtained as an input, and is supplied to one of the input terminals of the NAND gate 83 through the inverter 82. To the other input terminal of the NAND gate 83, the SAENB signal is supplied, and a result of an AND operation that is performed herein is supplied to one of the input terminals of the NAND gate 86 through the inverter 84.

To the other input terminal of the NAND gate 86, the CLKCHG or OSCC signal that becomes the above-described operation mode signal is supplied through the inverter 85, and a result of an AND operation-that is performed herein is supplied to one of the input terminals of the NAND gate 88. The output of the NAND gate 87, to which the above-described CLKCHG signal or OSCC signal and the SAENB signal act as the input, is supplied to the other input terminal of the HAND gate 88, and a result of an OR operation that is performed herein is supplied to the sense amplifier as the SAACT signal.

That is, the NAND gates 86, 87, and 88 operate as switching circuits in which the differentiating circuit 81 output and the SAENB signal act as inputs, CLKCHG or OSCC acts as a switching signal, and either one of inputs is supplied as the SAACT signal to the sense amplifier.

The timing chart being shown in FIG. 9 shows, from the top in sequence, individual signal waveforms of CLKCHG (OSCC) at "LOW", SAENB, the differentiating circuit 81 output (A), the NAND gate 86 output (B), SAACT, CLKCHG (OSCC) at "HIGH", SAENB, and SAACT.

As can be seen from the timing chart shown in FIG. 9, when CLKCHG or OSCC is "LOW", that is, when it operates in the low speed mode, it performs the same operation as the timing chart shown in FIG. 3, and when CLKCHG or OSCC is "HIGH", that is, when it operates in the high speed mode, it performs the same operation as the timing chart shown in FIG. 4. That is, the NAND gates 86, 87, and 88 shown in FIG. 8 operate as switching circuits in which the differentiating circuit 81 output and the SAENB signal act as inputs, CLKCHG or OSCC acts as a switching signal, and either one of the inputs acts as the SAACT signal to the sense amplifier.

In the circuit configuration shown in FIG. 10, reference numeral 91 indicates the above-described differentiating circuit, to which the NOR gate 96 output is supplied as an input. To the NOR gate 96, CLKCHG or OSCC and SAENB, via the inverter 95, are supplied.

The differentiating circuit 91 output, that is, an output obtained through the inverter 92, together with the SAENB are supplied to the NAND gate 93, and a result of an AND operation that is performed in this NAND gate 93 is supplied to the sense amplifier as the SAACT signal through the inverter 94.

The timing chart shown in FIG. 11 shows, from the top in sequence, individual signal waveforms of CLKCHG (OSCC) at "LOW", SAENB, the differentiating circuit 91 input (C), the differentiating circuit 91 output (D), SAACT, CLKCHG (OSCC) at "HIGH", SAENB; the differentiating circuit 91 input (C), the differentiating circuit 91 output (D), and SAACT.

As can be seen from the timing chart shown in FIG. 11, when the CLKCHG or OSCC is "LOW", that is, when it operates in the low speed mode, it performs the same operation as the timing chart shown in FIG. 3, and when the CTKCHG or OSCC is "HIGH", that is, when it operates in the high speed mode, it performs the same operation as the timing chart shown in FIG. 4.

Further, the above-described semiconductor integrated device is loaded into an electronic apparatus such as a clock, a game machine, a mobile phone and the like, and as a result thereof, a substantial reduction in the current drain (consumption) during low speed operation can be expected, and also it is possible to provide an electronic apparatus which is able to operate at a high frequency which is synchronized with a clock used in high speed operation.

Industrial Applicability

According to the present invention as described above, since the time for operating the reference potential generation circuit can be made constant when the operation frequency is low, the duty ratio when the frequency decreases can be made larger, and thus it is possible to reduce the current drain (consumption) substantially.

Also, according to the present invention, since the time for supplying the reference potential to the sense amplifier can be made constant when the operation frequency is low, even when a DC current flows-due to insufficient writing of the memory cell, the active time of the sense amplifier can be shorted when the frequency decreases, and thus it is possible to reduce the current drain (consumption).

Further, the present invention may obtain a noticeable effect in particular by using the semiconductor integrated device in which a flash-memory that requires a relatively large power is imbedded and the electronic apparatus into which the device is installed.

Moreover, a semiconductor integrated apparatus can be provided in which unstable operation during high speed operation of the memory is prevented by using the above-mentioned differentiating circuit output when the pulse width of the input signal is long, and by using the clock that is generated through the oscillator when the pulse width of the input signal is short, and a substantial reduction in the current drain (consumtion) during low speed operation can be expected, and also a semiconductor integrated device which is able to operate at a high frequency that is synchronized with the clock used during high speed operation can be provided. The present invention also aims to increase a battery capacity life during low speed operation by being installed in an electronic apparatus such as a clock, a game machine, a mobile phone and the like, and moreover a high performance electronic apparatus which can operate at a high frequency that is synchronized with the clock used during high speed operation can be provided.

What is claimed is:

1. A semiconductor integrated device which is embedded with a reference potential generation circuit that uses a memory cell, said semiconductor integrated device being characterized in that it comprises:
   a differentiating pulse generation circuit for generating a shorter signal when the pulse width of an input signal to said differentiating pulse generation circuit is, long and for activating said reference potential generation circuit.

2. A semiconductor integrated device according to claim 1, wherein said memory cell is constituted of a non-volatile memory.

3. A semiconductor integrated device which is embedded with a reference potential generation circuit that uses a pseudo memory cell, said semiconductor integrated device being characterized in that:
   with a differentiating pulse generation circuit constituted of a delay circuit and a gate circuit, a shorter signal is generated when the pulse width of an input signal to said differentiating pulse generation circuit is long, and said reference potential generation circuit is activated.

4. A semiconductor integrated device according to claim 3, wherein said pseudo memory cell is constituted of a non-volatile memory.

5. A semiconductor integrated device which is embedded with a reference potential generation circuit that uses a pseudo memory cell, and a sense amplifier that operates by inputting a reference potential that is generated by said reference potential generation circuit, said semiconductor integrated device being characterized in that:
   a reference potential is supplied to said amplifier only when a reference potential generation circuit enable signal that is generated by a differentiating pulse generation circuit is active.

6. A semiconductor integrated device according to claim 5, wherein said pseudo memory cell is constituted of a non-volatile memory.

7. A semiconductor integrated device according to claim 5, wherein a reference potential is supplied to said sense amplifier by said differentiating circuit output when the pulse width of the input signal is long, and by a clock that is generated through an oscillator when the pulse width of the input signal is short.

8. A semiconductor integrated device according to claim 7, wherein a relative length of the pulse width of said input signal is determined by a clock switching signal that is set as programmable in a register which is stored in the device.

9. A semiconductor integrated device according to claim 7, wherein a relative length of the pulse width of said input signal is determined by a selection signal of an oscillator that is set as programmable in a register, and which is stored in the device.

10. An electronic apparatus into which a semiconductor integrated device is installed, said semiconductor integrated device being embedded with a reference potential generation circuit that uses a memory cell, said electronic apparatus being characterized in that:

said electronic apparatus is installed with a semiconductor integrated device comprising a differentiating pulse generation circuit for generating a short signal when the pulse width of an input signal to said differentiating pulse generation circuit is long and for activating said reference potential generation circuit.

11. An electronic apparatus according to claim 10, wherein said electronic apparatus is installed with a semiconductor integrated device which supplies a reference potential to said sense amplifier by said differentiating circuit output when the pulse width of the input signal is long, and by a clock that is generated through an oscillator when the pulse width of the input signal is short.

* * * * *